United States Patent [19]
Mori

[11] Patent Number: 4,725,767
[45] Date of Patent: Feb. 16, 1988

[54] PHASE SHIFTER

[75] Inventor: Masaharu Mori, Tokyo, Japan

[73] Assignee: Clarion Co., Ltd, Tokyo, Japan

[21] Appl. No.: 52,313

[22] Filed: May 19, 1987

[30] Foreign Application Priority Data

May 27, 1986 [JP] Japan ................... 61-122856

[51] Int. Cl.⁴ .............................. H03H 7/18
[52] U.S. Cl. ................... 323/218; 323/219; 333/138; 333/172
[58] Field of Search ............ 323/212, 218, 219; 333/25, 138, 139, 140, 170–172

[56] References Cited

U.S. PATENT DOCUMENTS

| | | | |
|---|---|---|---|
| 2,648,773 | 8/1953 | Wallace, Jr. | 323/219 |
| 2,828,454 | 3/1958 | Khouri | 333/185 X |
| 3,529,233 | 9/1970 | Podell | 323/219 |
| 3,544,886 | 12/1970 | Hou et al. | 323/219 X |
| 3,775,668 | 11/1973 | Narayan | 323/218 |

OTHER PUBLICATIONS

"Active Constant-Gain Variable Phase Shift Network", A. R. Johnson, IBM Technical Disclosure Bulletin, vol. 13, No. 1, 6/70.

Primary Examiner—Patrick R. Salce
Assistant Examiner—Emanuel T. Voeltz
Attorney, Agent, or Firm—Flynn, Thiel, Boutell & Tanis

[57] ABSTRACT

A phase shifter includes first and second series-connected resistor circuits each including first and second resistors and each interposed between each one of two input terminals and each one of two output terminals, and includes capacitors each interposed between each one of medium points of the series-connected circuits and each one of two output terminals. The phase shifter also establishes a relationship of $RgRl=R^2$ where the value of the first resistor is $Rg/2$, the value of the second resistor is R, and the output resistance between the two output terminals is Rl.

4 Claims, 8 Drawing Figures

PHASE SHIFTER

FIELD OF THE INVENTION

This invention relates to a phase shifter, and more particularly to its improvement for best use in an integrated circuit.

BACKGROUND OF THE INVENTION

FIGS. 6(A) and 6(B) show typical prior art phase shifters among which the phase shifter of FIG. 6(A) is of a passive type including resistors 3 and 4, capacitors 5 and 6 and coils 7 and 8 connected between a power source 1 for entering an input voltage Vin and an output resistor 2 for taking out an output voltage Vout. The phase shifter of FIG. 6(B) is of an active type including resistors 10, 11 and 12, a capacitor 13 and an operational amplifier 14 connected between a power source 1 for entering an input voltage Vin and a takeout terminal 9 for taking out an output voltage Vout. These circuits are shown in "Electronic Filter Design Handbook" of McGraw-Hill, for example.

In the phase shifter of FIG. 6(A), if the following relationship is established:

$$L = \frac{2R}{\alpha_0} \quad (1)$$

$$C = \frac{2}{\alpha_0 R} \quad (2)$$

where R is the value of the resistor 2, the resistors 3 and 4 are R/2, respectively, C is the capacitance of the capacitors 5 and 6, L is the inductance of the coils 7 and 8, and $\alpha_0$ is a constant fixed by the material, etc., its frequency characteristic Vout/Vin is shown in FIG. 7 in which its amplitude A is uniform, and its phase $\theta(\omega)$ becomes:

$$\theta(\omega) = -2 \tan^{-1} \frac{\omega}{\alpha_0} \quad (3)$$

In the phase shifter of FIG. 6(B), if the following relationship is established:

$$\alpha_0 = \frac{1}{RC} \quad (4)$$

where R is the value of the resistor 11, and C is the capacitance of the capacitor 13, its amplitude A is also uniform, and its phase $\theta(\omega)$ equals equation (3).

It is more and more desired to incorporate high frequency circuits in an integrated circuit. However, the phase shifter shown in FIGS. 6(A) and 6(B) are not suitable for such a circuit integration. More specifically, the phase shifter of FIG. 6(A) requires coils, but it is difficult to provide in an integrated circuit coils or equivalent circuits operative against high frequency waves. Further, as will be understood from equations (1), (2) and (3), both values L and C must be varied in order to vary the phase, and it is hardly established.

In the phase shifter of FIG. 6(B) requiring the operational amplifier, it is difficult to establish a high level input impedance, a low output impedance, a high gain and other indispensable characteristics of the operational amplifier in high frequency ranges.

Any prior art phase shifters other than those shown in FIGS. 6(A) and 6(B) also require coils or a high level input impedance, and it is difficult to incorporate them in a high frequency integrated circuit.

OBJECT OF THE INVENTION

It is therefore an object of the invention to provide a phase shifter having a frequency characteristic in which the amplitude is uniform but the phase is exclusively and readily changed, so that it may be incorporated in a high frequency integrated circuit.

SUMMARY OF THE INVENTION

According to the invention, there is provided a phase shifter comprising first and second resistor circuits and first and second capacitor elements connected in series between respective first and second input terminals for entering an input signal and respective first and second output terminals for taking out an output signal, each said circuit having at least first and second resistor elements connected in series, said first capacitor element being connected between a junction of said first and second resistor elements in said first resistor circuit and said second output terminal, said second capacitor element being connected between a junction of said first and second resistor elements in said second resistor circuit and said first output terminal, said phase shifter being configured to establish a relationship RgRl=R² where said first and second resistor elements have a value Rg/2 and R respectively, and an output resistor element connected between said output terminals have a resistance value Rl.

With this arrangement, since the phase shifter is made exclusively by the resistor elements and the capacitor elements, the phase can readily be changed, and the phase shifter may be suitably incorporated in a high frequency integrated circuit.

DETAILED DESCRIPTION

Figure 1:
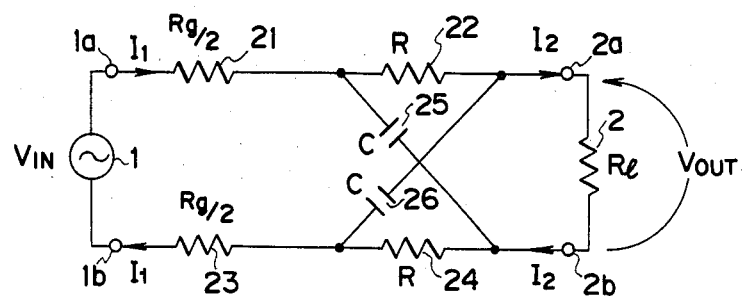
FIG. 1 is a principle diagram of a phase shifter according to the invention.

The invention is described below in detail, referring to a preferred embodiment illustrated in the drawings.

FIG. 1 is a fundamental circuit diagram of a phase shifter embodying the invention. Between both ends (input terminals 1a and 1b) of a power source 1 for generating an input voltage Vin and both ends (output terminals 2a and 2b) of an output resistor 2 for taking out an output voltage Vout, a first series-connected circuit of resistors 21 and 22 and a second series-connected circuit of resistors 23 and 24 are connected. Between a junction in each series-connected circuit and each end of the output resistor 2 is connected a phase shifting capacitor 25 (26).

In this circuit arrangement, if the following relationship is established:

$$RgRl = R^2 \quad (5)$$

$$\alpha_0 = \frac{1}{RC} \quad (6)$$

where the resistors 21 and 23 have a resistance $Rg/2$, $R$ is the resistance of the resistors 22 and 24, $Rl$ is the value of the output resistor 2, and C is the capacitance of the capacitors 25 and 26, the phase shifter has a frequency characteristic in which its amplitude is uniform, and its phase characteristic is as shown in equation (3).

Figure 2:
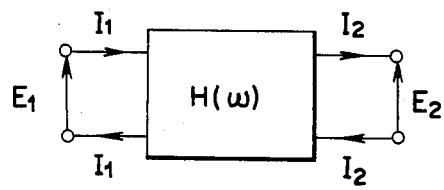
FIG. 2 is a diagram showing relationships among the F matrix, voltage and current.

In order to obtain the transfer function $H(\omega)$ of FIG. 1, the F matrix (four-terminal matrix) is used. The F matrix describes the input and output relationship as shown in equation (7) below in the diagram of FIG. 2.

$$\begin{bmatrix} E_1 \\ I_1 \end{bmatrix} = \begin{bmatrix} A & B \\ C & D \end{bmatrix} \begin{bmatrix} E_2 \\ I_2 \end{bmatrix} \quad (7)$$

In FIG. 1, putting $Vin = E_1$ and $Vout = E_2$, respective parameters A, B, C and D of the F matrix are expressed by:

$$A = \frac{Zc + R + 2Rg}{Zc - R} + \frac{2RZc + Rg(Zc + R)}{Zc - R} \cdot \frac{1}{Rl} \quad (8)$$

$$B = \frac{2RZc + Rg(Zc + R)}{Zc - R} \quad (9)$$

$$C = \frac{2}{Zc + R} + \frac{Zc + R}{Zc - R} \cdot \frac{1}{Rl} \quad (10)$$

$$D = \frac{Zc + R}{Zc - R} \quad (11)$$

Here, Zc is expressed by:

$$Zc = \frac{1}{j\omega c} \quad (12)$$

Since the transfer function $H(\omega)$ is expressed by:

$$H(\omega) = \frac{E_2}{E_1} = \frac{1}{A} \quad (13)$$

equation (8) leads to:

$$H(\omega) = \frac{(Zc - R)Rl}{Rl(Zc + R + 4Rg) + 2RZc + Rg(Zc + R)} \quad (14)$$

equation (5) leads to:

$$Rl = \frac{R^2}{Rg} \quad (15)$$

and equations (15) and (14) lead to:

$$H(\omega) = \left(\frac{R}{R + Rg}\right)^2 \cdot \frac{Zc - R}{Zc + R} \quad (16)$$

Further, equations (12) and (16) lead to:

$$H(\omega) = \left(\frac{R}{R + Rg}\right)^2 \cdot \frac{j\omega - \frac{1}{RC}}{j\omega + \frac{1}{RC}} \quad (17)$$

The phase $\theta(\omega)$ of the transfer function $H(\omega)$ is expressed by:

$$\theta(\omega) = -2 \tan^{-1} \frac{\omega}{\alpha_0} \quad (18)$$

Since the following equation is originally selected:

$$\alpha_0 = \frac{1}{RC} \quad (19)$$

they coincide with equations (3) and (4).

The absolute value of the transfer function $H(\omega)$ which is the amplitude characteristic of the phase shifter is expressed by:

$$|H(\omega)| = \left(\frac{R}{R + Rg}\right)^2 \quad (20)$$

and this is constant independently from the frequency.

Therefore, equations (18) through (20) meet the requirements of the phase shifter.

Next, the power gain Gp is obtained as follows.

The effective power Pa of the input voltage Vin is expressed by:

$$Pa = \frac{Vin^2}{4Rg} \quad (21)$$

and the power Pl consumed by the output resistor 2 is led from equation (20) as follows:

$$Pl = \left\{ \left(\frac{R}{R + Rg}\right)^2 Vin \right\}^2 / Rl \quad (22)$$

Equations (15) and (22) lead to:

$$Pl = \frac{R^2 Rg \, Vin^2}{(R + Rg)^4} \quad (23)$$

Therefore, the power gain Gp is expressed by:

$$Gp = \frac{Pl}{Pa} = \frac{4R^2 Rg^2}{(R + Rg)^4} \quad (24)$$

The maximum condition of the power gain Gp is:

$$\frac{\delta Gp}{\delta Rg} = 0 \quad (25)$$

and this leads to:

$$Rg = R \quad (26)$$

From equations (26) and (24), the maximum value Gpmax of the power gain Gp is expressed by:

$$G_{p\max} = \frac{1}{4} \quad (27)$$

This corresponds to −6 dB.

An embodiment of the invention based on the principle of FIG. 1 is explained below, referring to FIGS. 3 through 5.

Figure 3:
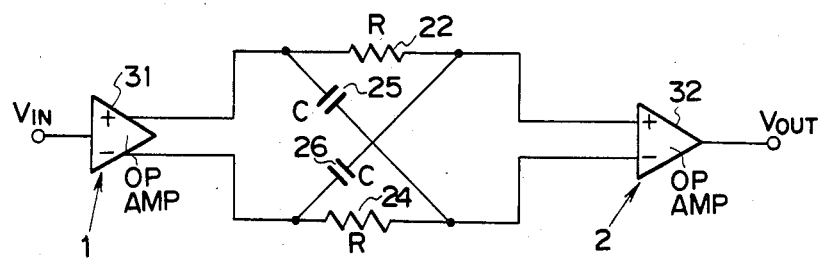
FIGS. 3 through 5 are circuit arrangements of different embodiments of the phase shifter according to the invention.

FIG. 3 shows an example using a differential amplifier in view of the fact that the principle diagram of FIG. 1 is a balance-type circuit.

In FIG. 3, reference numeral designates a differential amplifier having two output terminals 31a and 31b whose resistance is Rg/2 respectively, and reference numeral 32 denotes a differential amplifier having two input terminals 32a and 32b whose input impedance is Rl/2 respectively.

A phase shifter whose center frequency is 100 MHz is obtained by establishing C=15.9 pF when R=Rg=Rl=100Ω and its phase is −90° at 100 MHz. These values of the resistors and capacitors facilitate incorporation of the circuit of FIG. 3 in an integrated circuit.

Figure 4:
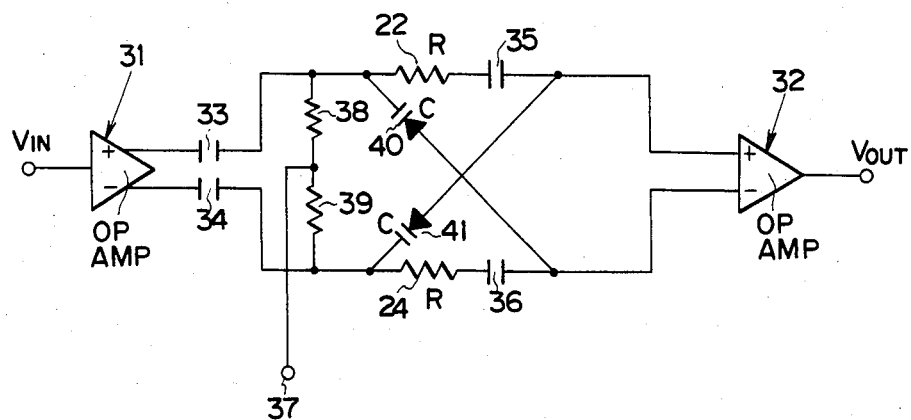

FIG. 4 shows a variable phase shifter including coupling capacitors 33 through 36, a bias applying terminal 37, bias applying resistors 38 and 39, and variable capacitor diodes 40 and 41 employed as phase shifting variable capacitors.

With this arrangement of the invention phase shifter, since its amplitude in its frequency characteristic is independent from the value of the phase shifting capacitors, variable capacitors may be used as the phase shifting capacitors to establish a variable phase shifter. In the example of FIG. 4, variable capacitance diodes 40 and 41 are used as the variable capacitors. It should be noted that the terminal 37 is supplied with a d.c. bias voltage to be applied to the variable capacitance diodes 40 and 41. The coupling capacitors 33 through 36 are used to cut the bias voltage so that the bias voltage never affects any circuit other than the variable capacitance diodes. These coupling capacitors and the resistors 38 and 39 have values never affecting the phase shifting operation of the device.

Figure 5:
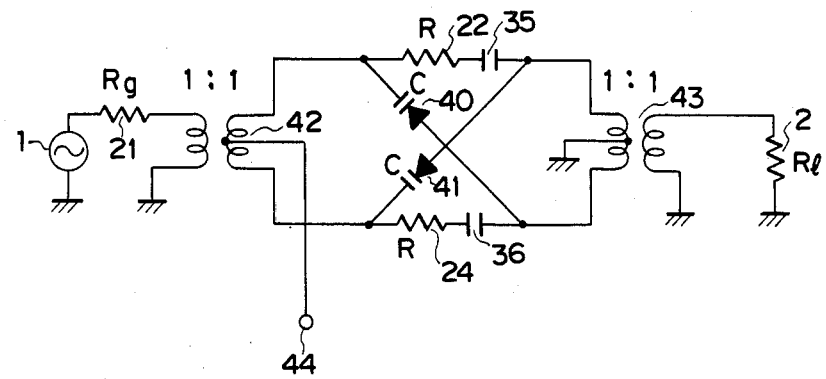
Figure 6A:
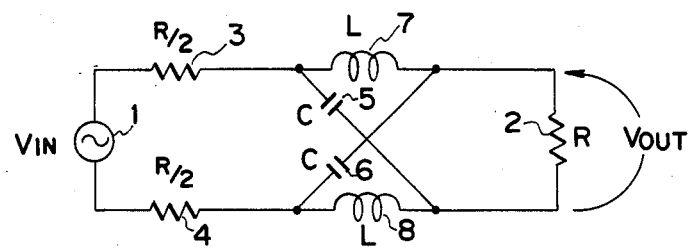
FIGS. 6A and 6B are a circuit arrangement of a prior art phase shifter.
Figure 6B:
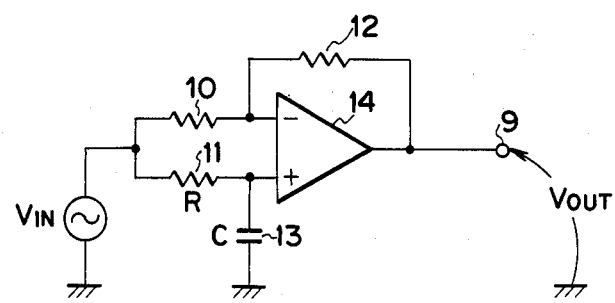
Figure 7:
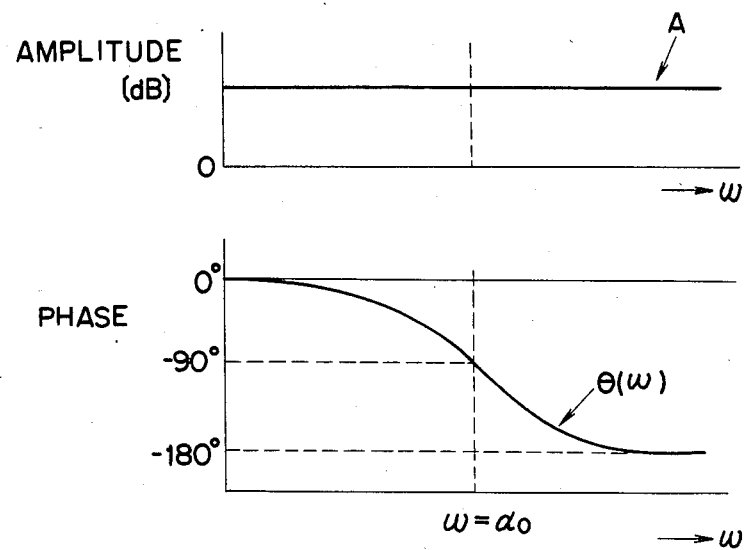
FIG. 7 is a diagram showing the frequency characteristic of a phase shifter.

FIG. 5 shows an example using a transformer in lieu of a differential amplifier. Reference numeral 21' designates a resistor whose resistance is Rg, reference numerals 42 and 43 denote transformers which each have a middle point tap in its secondary portion and have a transformation ratio of 1:1. Reference numeral 44 refers to a bias applying terminal.

This transformer does not require any driving power, and the use of middle point taps facilitates application of a bias voltage.

As described above, since the invention phase shifter is exclusively composed of the resistors and the capacitors, it does not require any inductance, operational amplifier, etc., and readily changes the phase. This facilitates incorporation of the phase shifter in a high frequency integrated circuit.

What is claimed is:

1. A phase shifter comprising first and second resistor circuits and first and second capacitor elements connected in series between respective first and second input terminals for entering an input signal and respective first and second output terminals for taking out an output signal, each said circuit having at least first and second resistor elements connected in series, said first capacitor element being connected between a junction of said first and second resistor elements in said first resistor circuit and said second output terminal, said second capacitor element being connected between a junction of said first and second resistor elements in said second resistor circuit and said first output terminal, said phase shifter being configured to establish a relationship $RgRl = R^2$ where said first and second resistor elements have a value Rg/2 and R respectively, and an output resistor element connected between said output terminals have a resistance value Rl.

2. A phase shifter of claim 1 wherein said first resistor elements of said first and second resistor circuits and said output resistor element are first and second differential amplifiers, respectively.

3. A phase shifter of claim 2 wherein said first and second capacitor elements are first and second variable capacitor elements, respectively.

4. A phase shifter of claim 1 wherein said first resistor elements of said first and second resistor circuits are first transformers each having a resistance value Rg and a transformation ratio of 1:1, and said output resistor element is a second transformer having a resistance value Rl and a transformation ratio of 1:1.

* * * * *